US011868187B2

(12) United States Patent
Chen et al.

(10) Patent No.: US 11,868,187 B2
(45) Date of Patent: Jan. 9, 2024

(54) CIRCUIT BOARD

(71) Applicant: ASUSTeK COMPUTER INC., Taipei (TW)

(72) Inventors: Po-Ting Chen, Taipei (TW); Chang-Hung Chen, Taipei (TW); Chih-Hung Chuang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/709,439

(22) Filed: Mar. 31, 2022

(65) Prior Publication Data
US 2023/0010194 A1 Jan. 12, 2023

(30) Foreign Application Priority Data
Jul. 7, 2021 (TW) .................................. 110125044

(51) Int. Cl.
H05K 7/14 (2006.01)
G06F 1/18 (2006.01)
(52) U.S. Cl.
CPC .............. *G06F 1/186* (2013.01); *G06F 1/185* (2013.01); *H05K 7/1402* (2013.01)
(58) Field of Classification Search
CPC ........ G06F 1/186; G06F 1/185; H05K 7/1402
USPC .......................................................... 361/326
See application file for complete search history.

(56) References Cited

U.S. PATENT DOCUMENTS

| 4,606,591 A | * | 8/1986 | Bloch | H05K 7/1409 439/157 |
| 4,712,848 A | * | 12/1987 | Edgley | H01R 12/7005 439/350 |
| 5,035,634 A | * | 7/1991 | Hasircoglu | H01R 13/62972 439/157 |
| 5,220,485 A | * | 6/1993 | Chakrabarti | H05K 7/1404 361/720 |
| 5,224,016 A | * | 6/1993 | Weisman | H05K 7/1404 361/728 |

(Continued)

FOREIGN PATENT DOCUMENTS

| CN | 205485760 | 8/2016 |
| CN | 111026244 | 4/2020 |

(Continued)

OTHER PUBLICATIONS

"Office Action of Taiwan Counterpart Application", dated Apr. 19, 2022, with English translation thereof, p. 1-p. 11.

(Continued)

*Primary Examiner* — Anatoly Vortman
(74) *Attorney, Agent, or Firm* — Hamre, Schumann, Mueller & Larson, P.C.

(57) ABSTRACT

A circuit board includes a board body, a card slot, a release structure, and a transmission mechanism. The card slot is disposed on the board body and adapted for inserting an expansion card. The release structure is rotatably disposed beside the card slot. The transmission mechanism includes a contact part and a stressed part that are linked to each other, wherein the contact part is connected to the release structure. When the stressed part receives an external force, the contact part is moved correspondingly, so that the release structure is rotated relative to the card slot, thereby releasing the expansion card.

11 Claims, 11 Drawing Sheets

(56) References Cited

U.S. PATENT DOCUMENTS

| | | | | |
|---|---|---|---|---|
| 5,472,353 A * | 12/1995 | Hristake | ............ | H05K 7/20545 |
| | | | | 361/709 |
| 6,285,564 B1 * | 9/2001 | O'Brien | ............... | H05K 7/1404 |
| | | | | 361/801 |
| 6,767,230 B2 * | 7/2004 | Lai | ..................... | H01R 12/7029 |
| | | | | 439/153 |
| 7,505,251 B2 * | 3/2009 | Canfield | ............. | H05K 5/0217 |
| | | | | 361/679.02 |
| 7,887,334 B2 * | 2/2011 | Miki | .................. | H01R 12/7029 |
| | | | | 439/157 |
| 8,559,187 B2 * | 10/2013 | Peng | ....................... | G06F 1/185 |
| | | | | 361/801 |
| 8,559,188 B2 * | 10/2013 | Chiu | ....................... | G06F 1/186 |
| | | | | 361/801 |
| 2004/0121636 A1 * | 6/2004 | Lai | ..................... | H01R 12/7029 |
| | | | | 439/153 |
| 2004/0257785 A1 * | 12/2004 | Chen | ....................... | G06F 1/186 |
| | | | | 361/807 |
| 2005/0003692 A1 * | 1/2005 | Allirot | ............... | H01R 12/7011 |
| | | | | 439/160 |
| 2009/0104793 A1 * | 4/2009 | Chung | ............. | H01R 13/62988 |
| | | | | 439/59 |
| 2012/0178276 A1 * | 7/2012 | Lee | .................... | H01R 12/7005 |
| | | | | 439/327 |
| 2014/0363994 A1 * | 12/2014 | Li | ...................... | H01R 12/7029 |
| | | | | 439/160 |
| 2017/0187157 A1 * | 6/2017 | Hsu | ................... | H01R 13/6581 |

FOREIGN PATENT DOCUMENTS

| | | |
|---|---|---|
| CN | 112306187 | 2/2021 |
| CN | 213240988 | 5/2021 |
| TW | I379465 B | 12/2012 |
| TW | I610502 B | 1/2018 |

OTHER PUBLICATIONS

"Notice of Allowance of Taiwan Counterpart Application", dated May 27, 2022, with English translation thereof, p. 1-p. 4.

* cited by examiner

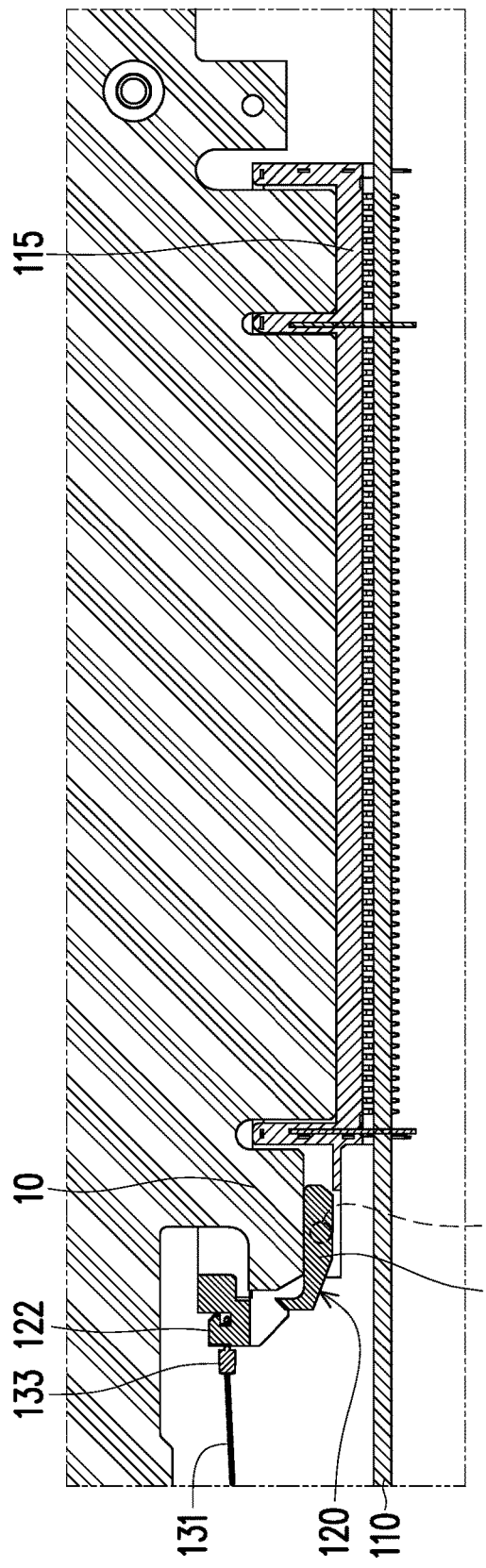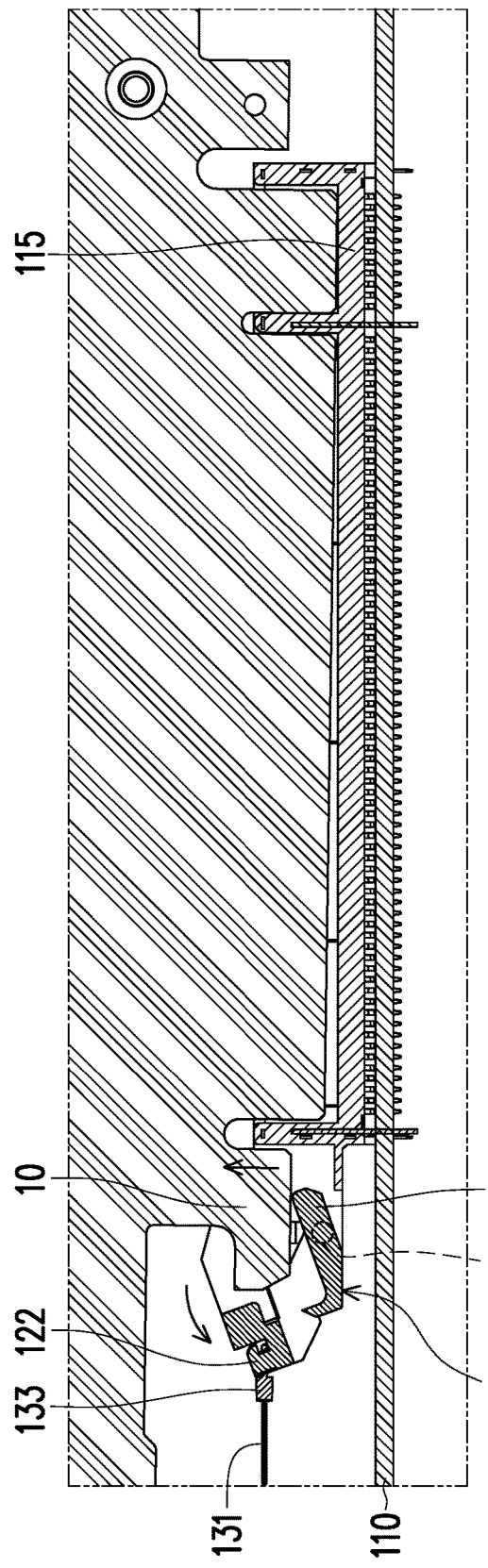

CIRCUIT BOARD

CROSS-REFERENCE TO RELATED APPLICATION

This application claims the priority benefit of Taiwanese application no. 110125044, filed on Jul. 7, 2021. The entirety of the above-mentioned patent application is hereby incorporated by reference herein and made a part of this specification.

BACKGROUND OF THE INVENTION

Field of the Invention

The disclosure is related to a circuit board, and particularly to a circuit board having a release structure.

Description of Related Art

Generally speaking, to release a graphics card inserted in a card slot on a motherboard, a graphics card release structure next to a turning card slot is used to release and lift the graphics card. However, with the improvement of the specifications of related equipment around the motherboard (for example: the increase in the dimensions of the CPU tower radiator, the larger size of the heat dissipation elements, the increase in the number of exterior decorative members, etc.), after the graphics card is inserted into the card slot, most of the area of the graphics card release structure is blocked, making it difficult for users to press. At present, users often use other tools to press the graphics card release structure. However, doing so often causes damage to the graphics card release structure, and the graphics card release structure is not easy to press, and the elements on the motherboard may even be damaged, resulting in the inability to readily release/replace the graphics card, and resulting in poor user experience.

SUMMARY OF THE INVENTION

The disclosure provides a circuit board including a board body, a card slot, a release structure, and a transmission mechanism. The card slot is disposed on the board body and adapted for inserting an expansion card. The release structure is rotatably disposed beside the card slot. The transmission mechanism includes a contact part and a stressed part that are linked to each other, wherein the contact part is connected to the release structure. When the stressed part receives an external force, the contact part is moved correspondingly, so that the release structure is rotated relative to the card slot, thereby releasing the expansion card.

The circuit board of the disclosure uses a transmission mechanism to rotate the release structure relative to the card slot, thereby releasing the expansion card. In this way, even if the release structure is blocked by structures such as the expansion card and heat dissipation fins, users may still readily rotate the release structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a schematic partial cross-sectional diagram of the circuit board of FIG. 1.

FIG. 5 is a schematic diagram of a linkage part of FIG. 4 being pulled.

DESCRIPTION OF THE EMBODIMENTS

Figure 1A:
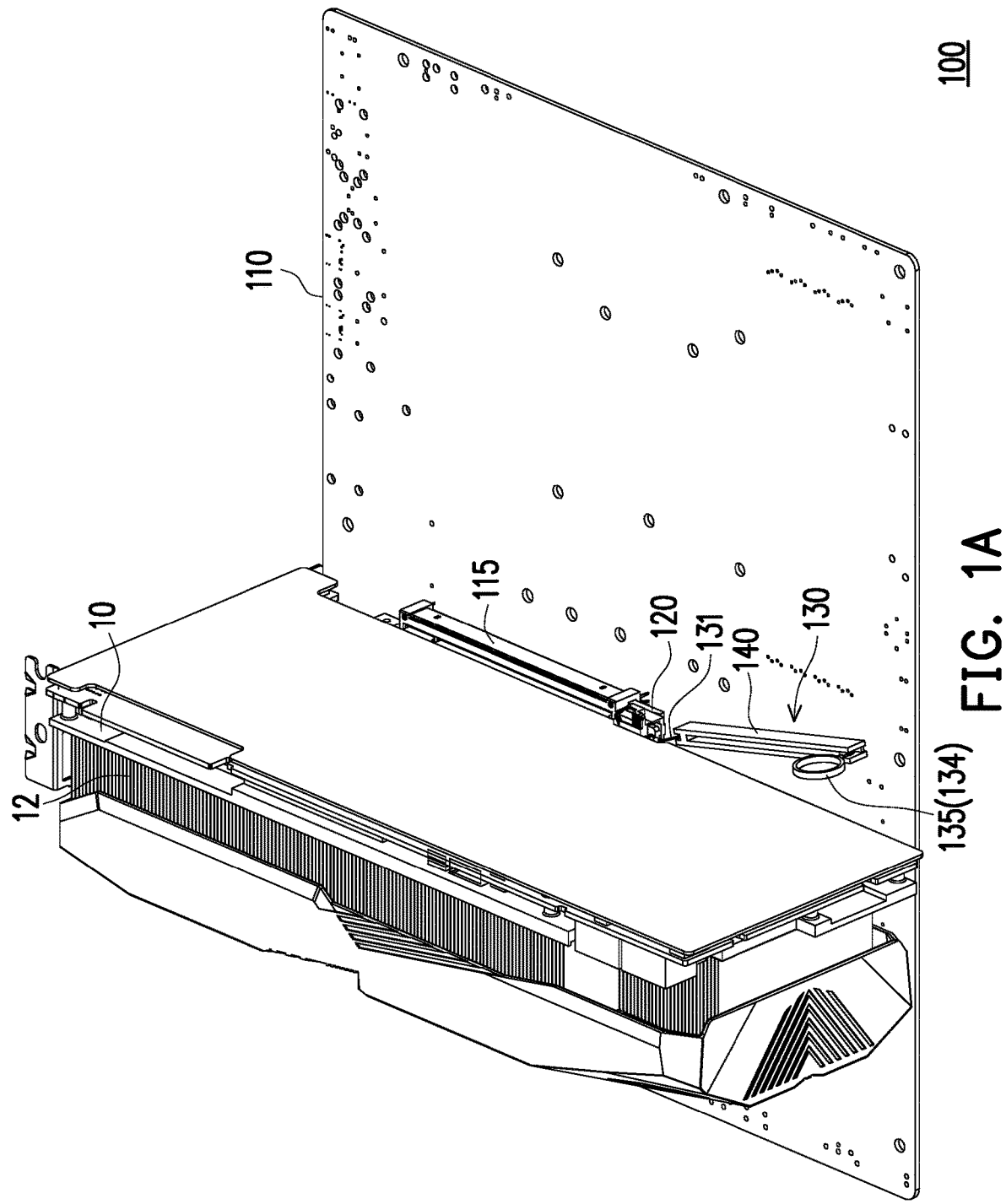
FIG. 1A is a schematic diagram of a circuit board according to an embodiment of the disclosure.
Figure 1B:
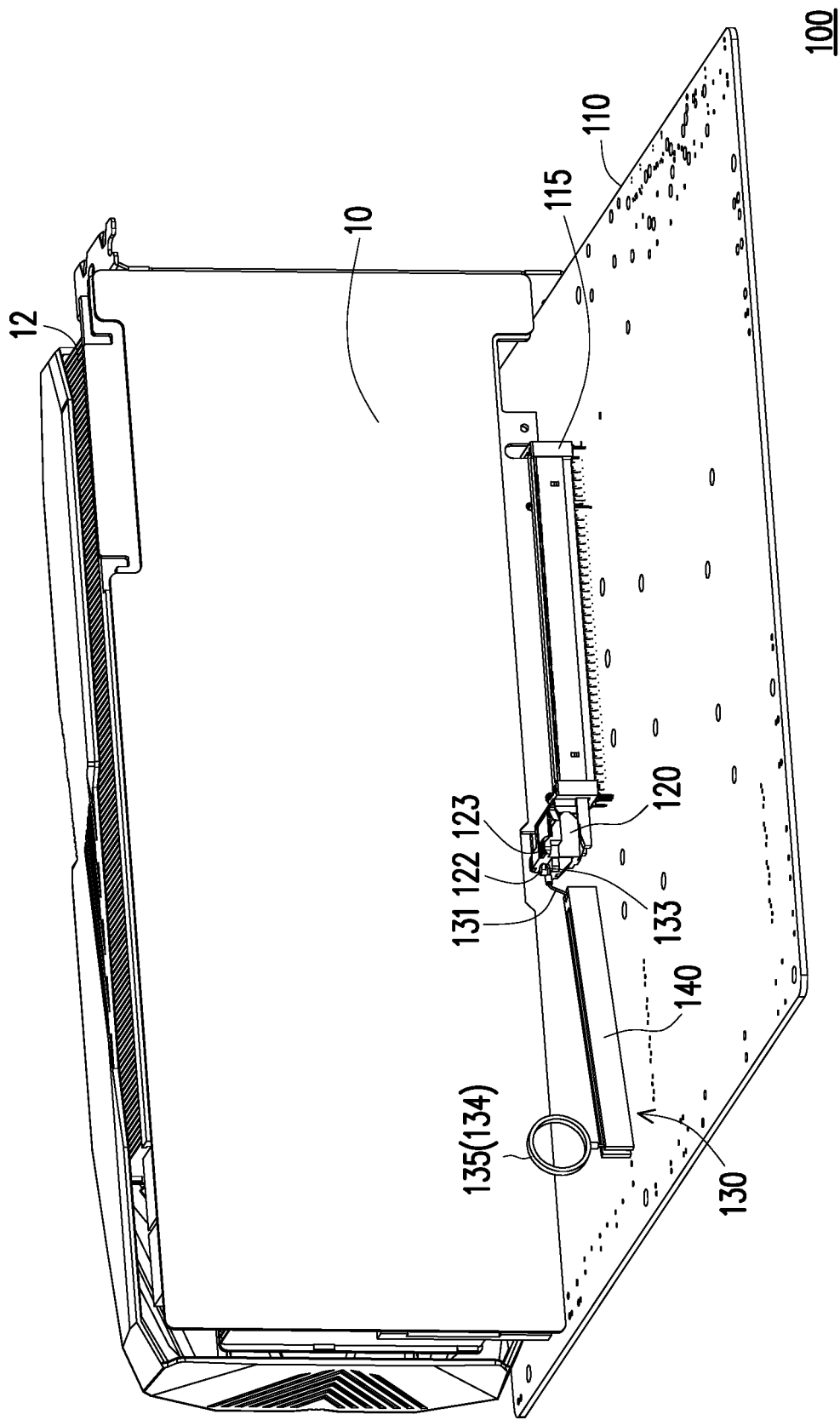
FIG. 1B is a schematic diagram of FIG. 1A from another angle.
Figure 2:
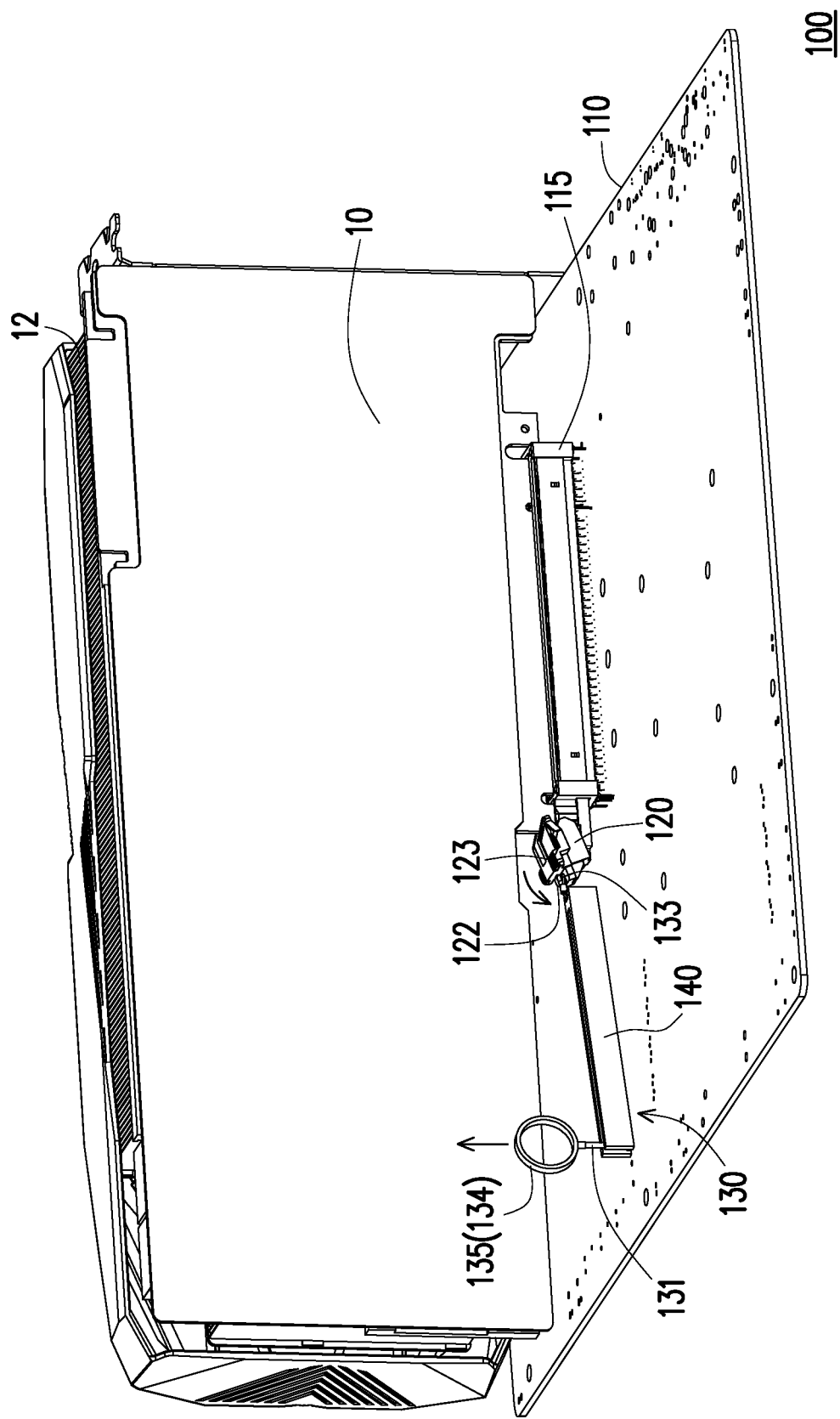
FIG. 2 is a schematic diagram of pulling a pull ring of the circuit board of FIG. 1.

FIG. 1A is a schematic diagram of a circuit board according to an embodiment of the disclosure. FIG. 1B is a schematic diagram of FIG. 1A from another angle. FIG. 2 is a schematic diagram of pulling a pull ring of the circuit board of FIG. 1. Please refer to FIG. 1A to FIG. 2, a circuit board 100 of the present embodiment is adapted for inserting an expansion card 10. The expansion card 10 is, for example, a graphics card, but the type of the expansion card 10 is not limited thereto. Generally speaking, the expansion card 10 is mounted with heat dissipation fins 12 and a fan.

In the present embodiment, the circuit board 100 includes a board body 110, a card slot 115, a release structure 120, and a transmission mechanism 130. The card slot 115 is disposed on the board body 110 and may be used for inserting the expansion card 10. The card slot 115 is, for example, a PCI-E slot, but the type of the card slot 115 is not limited thereto.

The release structure 120 is rotatably disposed beside the card slot 115, and turning the release structure 120 may push up and release the expansion card 10 inserted into the card slot 115. It may be seen from FIG. 1A that the release structure 120 is partially blocked by the expansion card 10 and the heat dissipation fins 12, and it is difficult for the user to directly press the release structure 120.

In an embodiment, the transmission mechanism 130 is linked to the release structure 120, and the circuit board 100 may rotate the release structure 120 via the transmission mechanism 130 as shown in FIG. 2 to release the expansion card 10.

Figure 3:
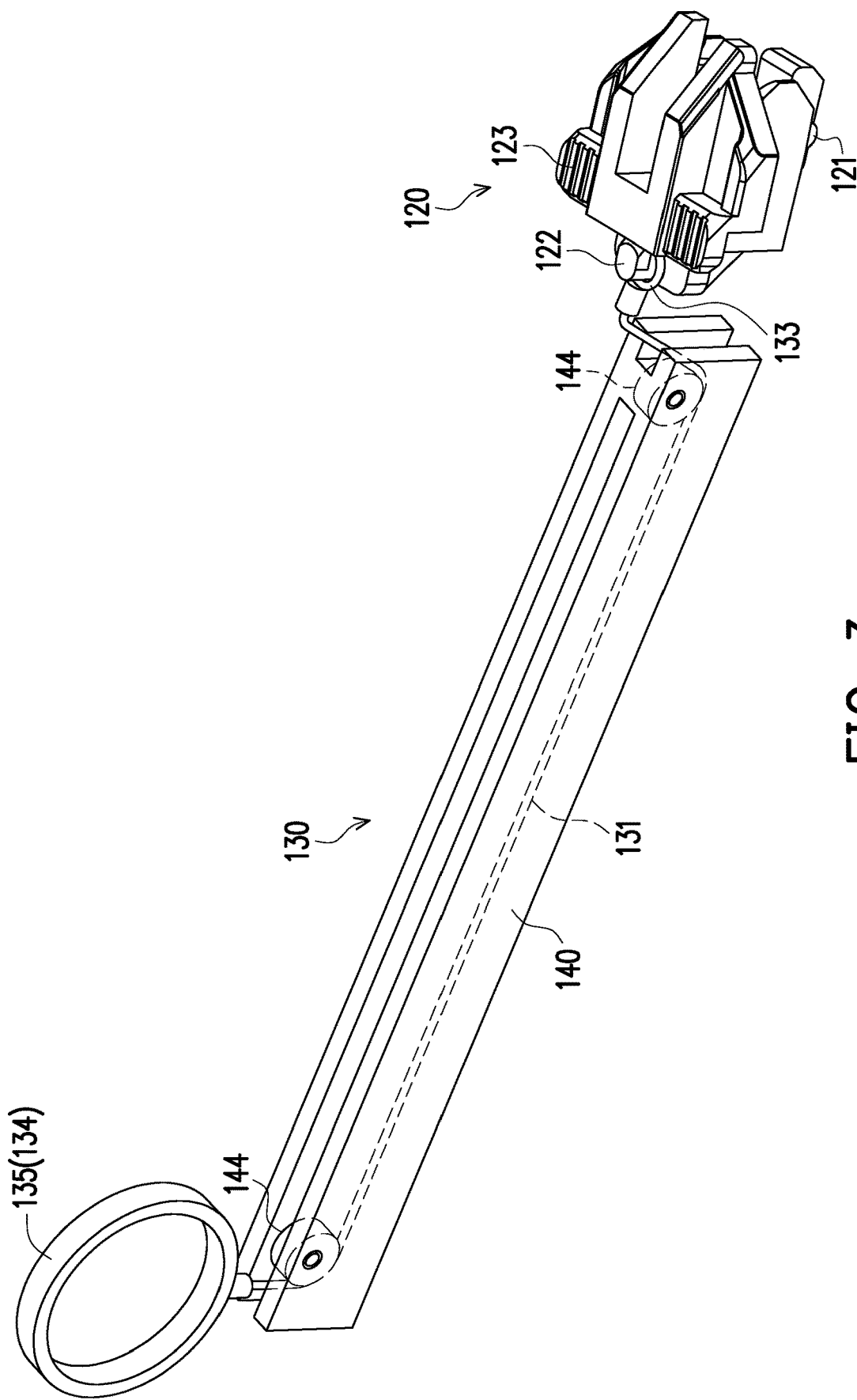
FIG. 3 is a schematic diagram of a release structure and a transmission mechanism of the circuit board of FIG. 1.

FIG. 3 is a schematic diagram of a release structure and a transmission mechanism of the circuit board of FIG. 1. Please refer to FIG. 3. In the present embodiment, the release structure 120 includes a rotating shaft 121, a column body 122, and a pressing part 123. The release structure 120 is pivotally connected to the card slot 115 via the rotating shaft 121 (FIG. 1A). The pressing part 123 may be pressed by the user to rotate the release structure 120.

The transmission mechanism 130 includes a contact part 133, a stressed part 134, and a linkage part 131 that is connected to the contact part 133 and the stressed part 134. The contact part 133 is connected to the release structure 120. Specifically, the contact part 133 is in contact with the release structure 120 so that the release structure 120 is linked to the contact part 133. The contact part 133 is linked to the stressed part 134 via the linkage part 131.

In an embodiment, the linkage part 131 is a wire, and an end of the linkage part 131 is connected to the contact part 133. The contact part 133 is, for example, a hook, and the contact part 133 is disposed at an end of the linkage part 131 and hooked on the column body 122 of the release structure 120. The stressed part 134 includes a pull ring 135 and is disposed at another end of the linkage part 131.

In an embodiment, the contact part 133 is linked to the stressed part 134 via the linkage part 131. Of course, in other embodiments, the linking manner of the contact part 133 and the stressed part 134 is not limited thereto.

As may be seen from FIG. 3, in the present embodiment, the transmission mechanism 130 further includes a base body 140 and at least one roller 144 rotatably disposed in the base body 140. The linkage part 131 is movably disposed at the base body 140 and wound around the outer edge of the roller 144. The roller 144 may be used as a tool for tinning the linkage part 131. When the linkage part 131 is moved, the roller 144 may be driven by the linkage part 131 to be rotated relative to the base body 140 to reduce the friction between the linkage part 131 and the base body 140.

Please return to FIG. 2, since the pressing part 123 of the release structure 120 may be blocked by the expansion card 10 and the heat dissipation fins 12, the pressing part 123 of the release structure 120 is not readily pressed. In the present embodiment, the transmission mechanism 130 is located far away from the expansion card 10 and the heat dissipation fins 12, so that the transmission mechanism 130 is not blocked by the expansion card 10 and the heat dissipation fins 12. Therefore, the user may readily access the transmission mechanism 130.

In other embodiments, the transmission mechanism 130 may also be partially located under the expansion card 10 and the heat dissipation fins 12, the stressed part 134 is located at a position not blocked by the expansion card 10 and the heat dissipation fins 12, and the user may still readily access the transmission mechanism 130. The position of the transmission mechanism 130 is not limited thereto.

In addition, since the contact part 133 is directly connected to the release structure 120, the stressed part 134 of the transmission mechanism 130 is farther away from the release structure 120 than the contact part 133. In other words, the distance between the stressed part 134 and the release structure 120 is greater than the distance between the contact part 133 and the release structure 120. The stressed part 134 may be disposed at a place more convenient for the user to operate, and is disposed corresponding to the space configuration on the board body 110.

In the present embodiment, the user only needs to pull the stressed part 134 (the pull ring 135) to pull the linkage part 131, so that the contact part 133 drives the column body 122 of the release structure 120 to be rotated relative to the rotating shaft 121 to release the expansion card 10.

FIG. 4 is a schematic partial cross-sectional diagram of the circuit board of FIG. 1. FIG. 5 is a schematic diagram of the linkage part of FIG. 4 being pulled. Referring to FIG. 4 and FIG. 5, the expansion card 10 is inserted into the card slot 115. When the linkage part 131 is pulled, the contact part 133 drives the column body 122 of the release structure 120 to be rotated relative to the rotating shaft 121, and a pushing part 124 of the release structure 120 is rotated with the rotating shaft 121 and faces upward to push the expansion card 10. Therefore, after the release structure 120 is rotated, the expansion card 10 is slightly lifted to facilitate the user to take.

Moreover, when the user wants to insert the expansion card 10 into the card slot 115, the expansion card 10 presses the pushing part 124 of the release structure 120 to turn the release structure 120 back to the original position (FIG. 4), and the release structure 120 drives the linkage part 131 to drive the pull ring 135 back to the original position.

In the present embodiment, the pulling direction of the pull ring 135 is upward as an example, and is not limited thereto. In an embodiment, the stressed part 134 (the pull ring 135) may also be connected to a driving module (for example, a motor). That is, a motor may be used to pull the release structure 120 to release the graphics card.

Figure 6:
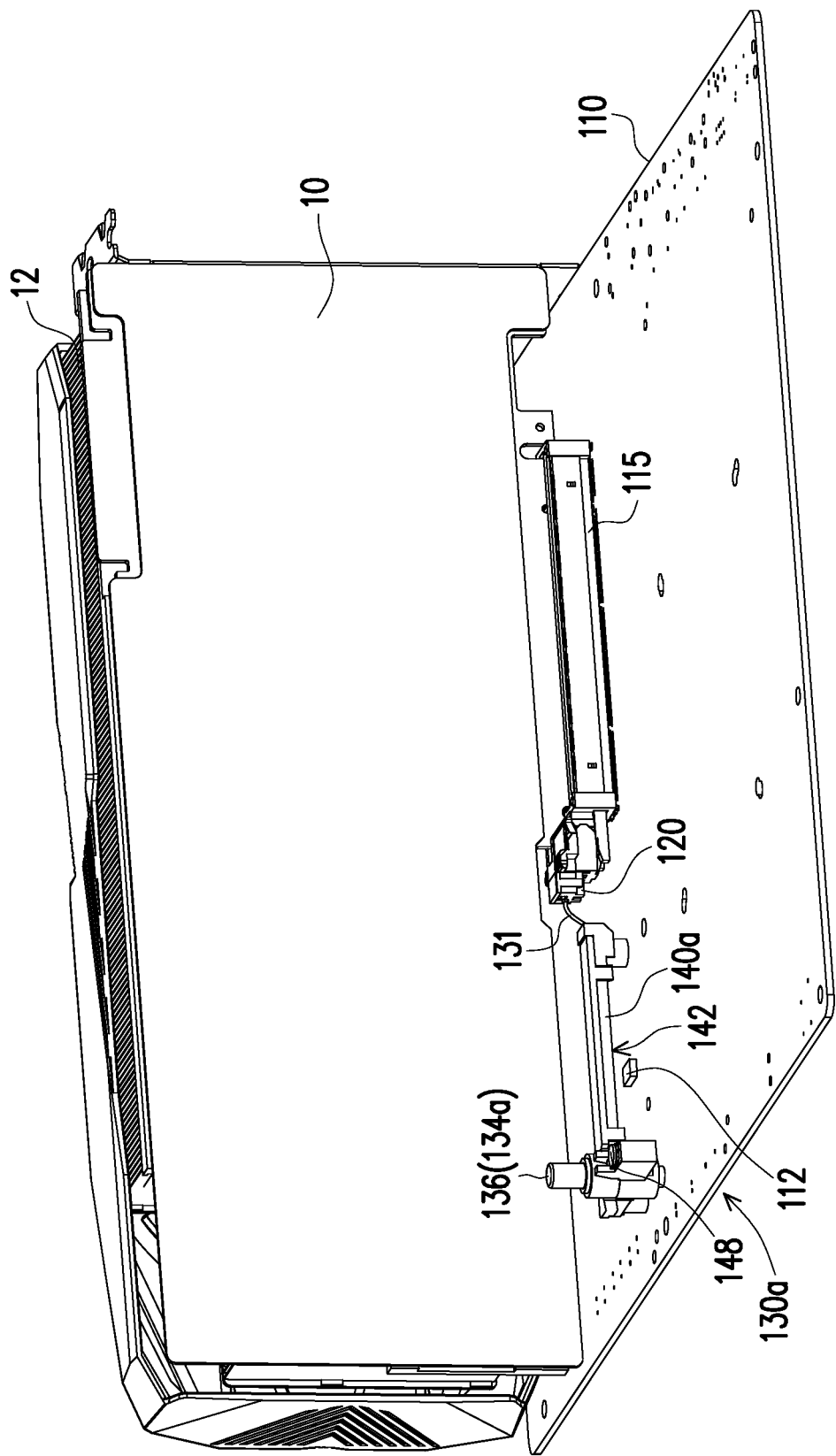
FIG. 6 is a schematic diagram of a circuit board according to another embodiment of the disclosure.
Figure 7:
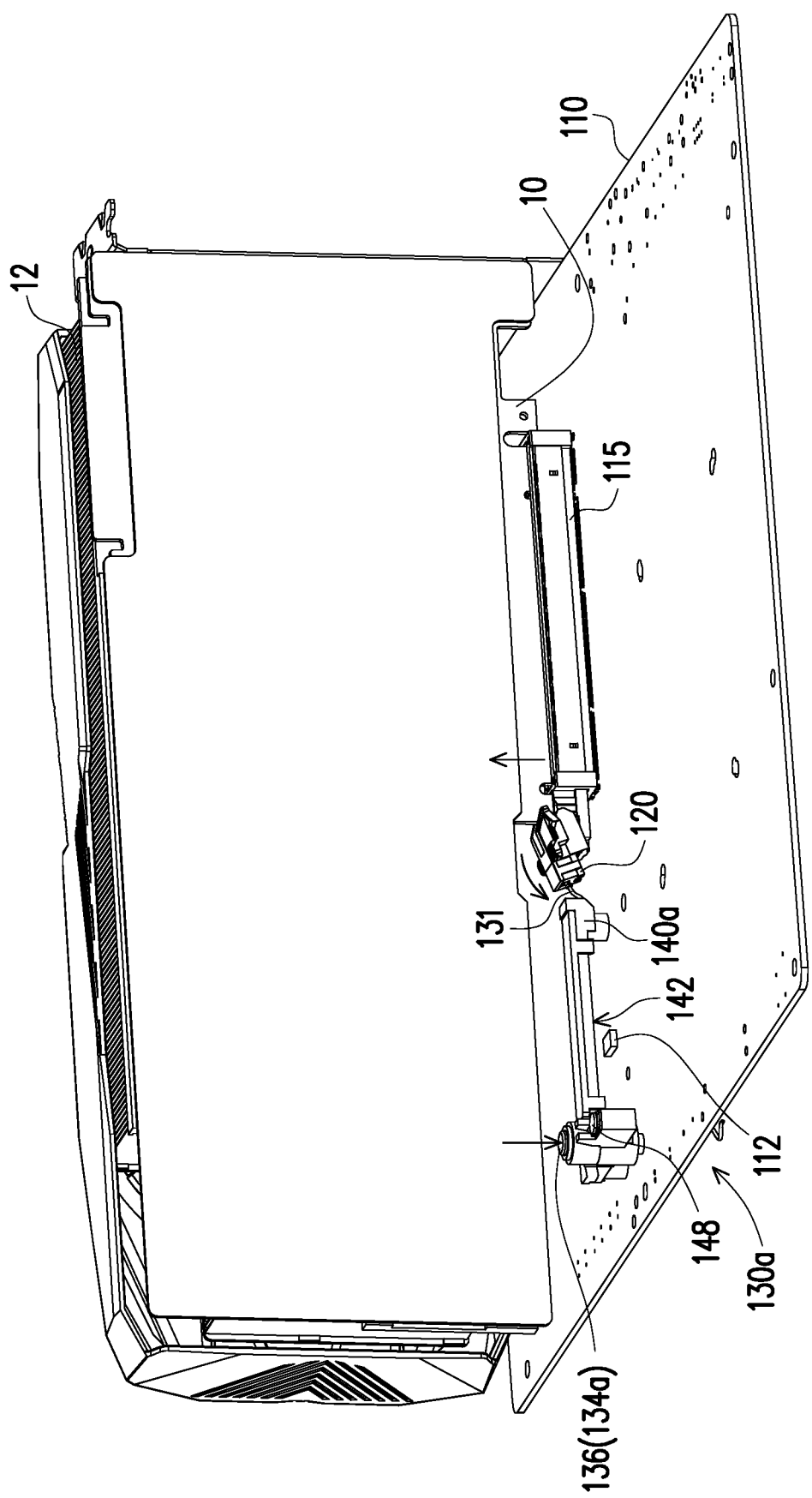
FIG. 7 is a schematic diagram of pressing a button of the circuit board of FIG. 6.
Figure 8:
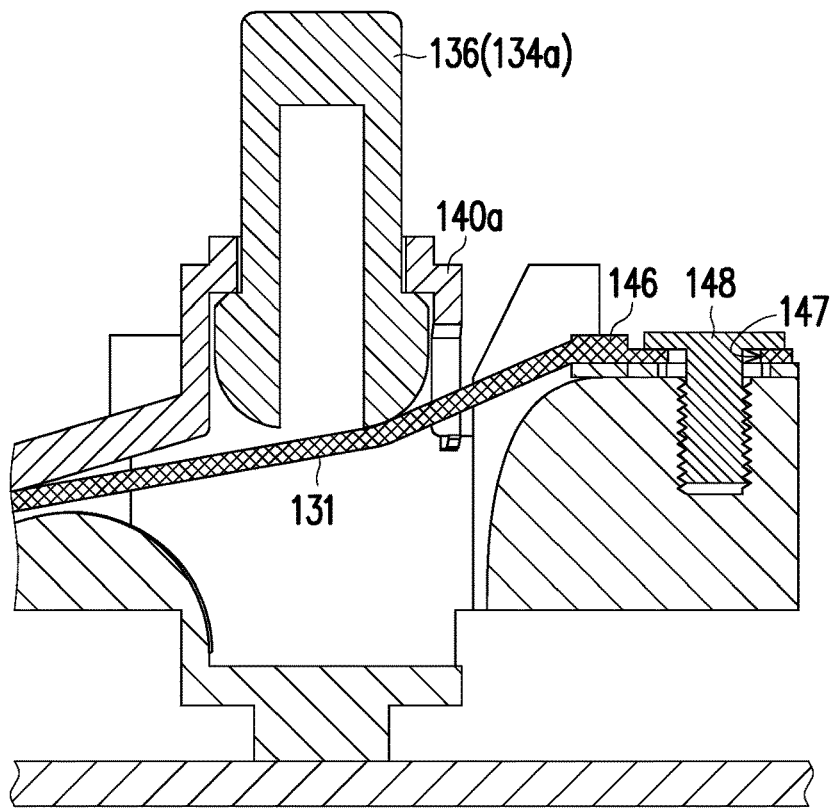
FIG. 8 is a schematic partial cross-sectional diagram of FIG. 6.
Figure 9:
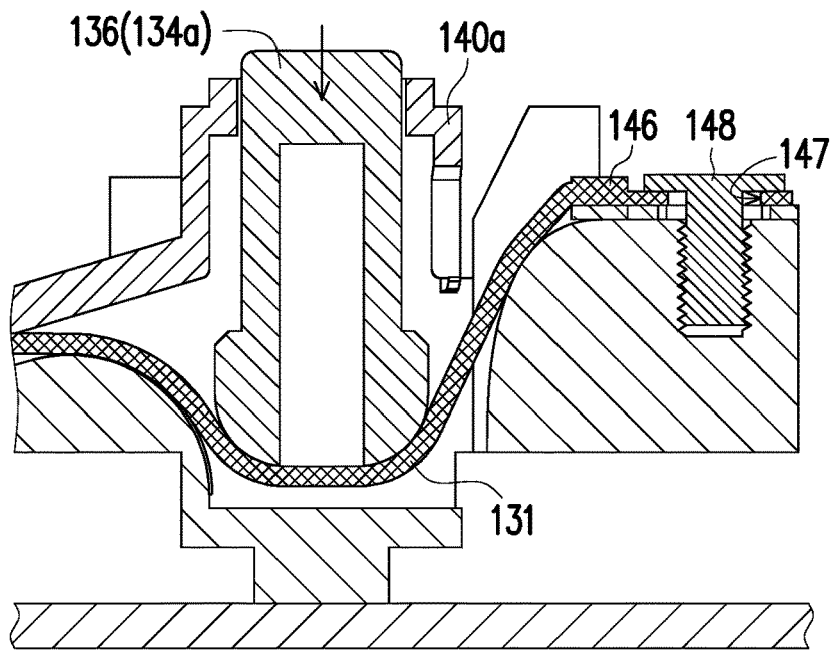
FIG. 9 is a schematic partial cross-sectional diagram of FIG. 7.

FIG. 6 is a schematic diagram of a circuit board according to another embodiment of the disclosure. FIG. 7 is a schematic diagram of pressing a button of the circuit board of FIG. 1. FIG. 8 is a schematic partial cross-sectional diagram of FIG. 6. FIG. 9 is a schematic partial cross-sectional diagram of FIG. 7.

Referring to FIG. 6 to FIG. 9, the main difference between a transmission mechanism 130a of the present embodiment and the transmission mechanism 130 of FIG. 3 is that in the present embodiment, a stressed part 134a of the transmission mechanism 130a includes a button 136 movably disposed at a base body 140a. As shown in FIG. 8, the linkage part 131 is fixed to the base body 140a at an end close to the button 136 (the right end of FIG. 8), and the button 136 is pressed against the linkage part 131.

When the button 136 is pressed down and moved to the position of FIG. 9, the button 136 pushes the linkage part 131 downwards. Since the linkage part 131 is fixed on the base body 140a at the right end of FIG. 9, when the linkage part 131 is pressed down, the left end of the linkage part 131 is pulled, so that the release structure 120 is pulled to release the expansion card 10.

Figure 10:
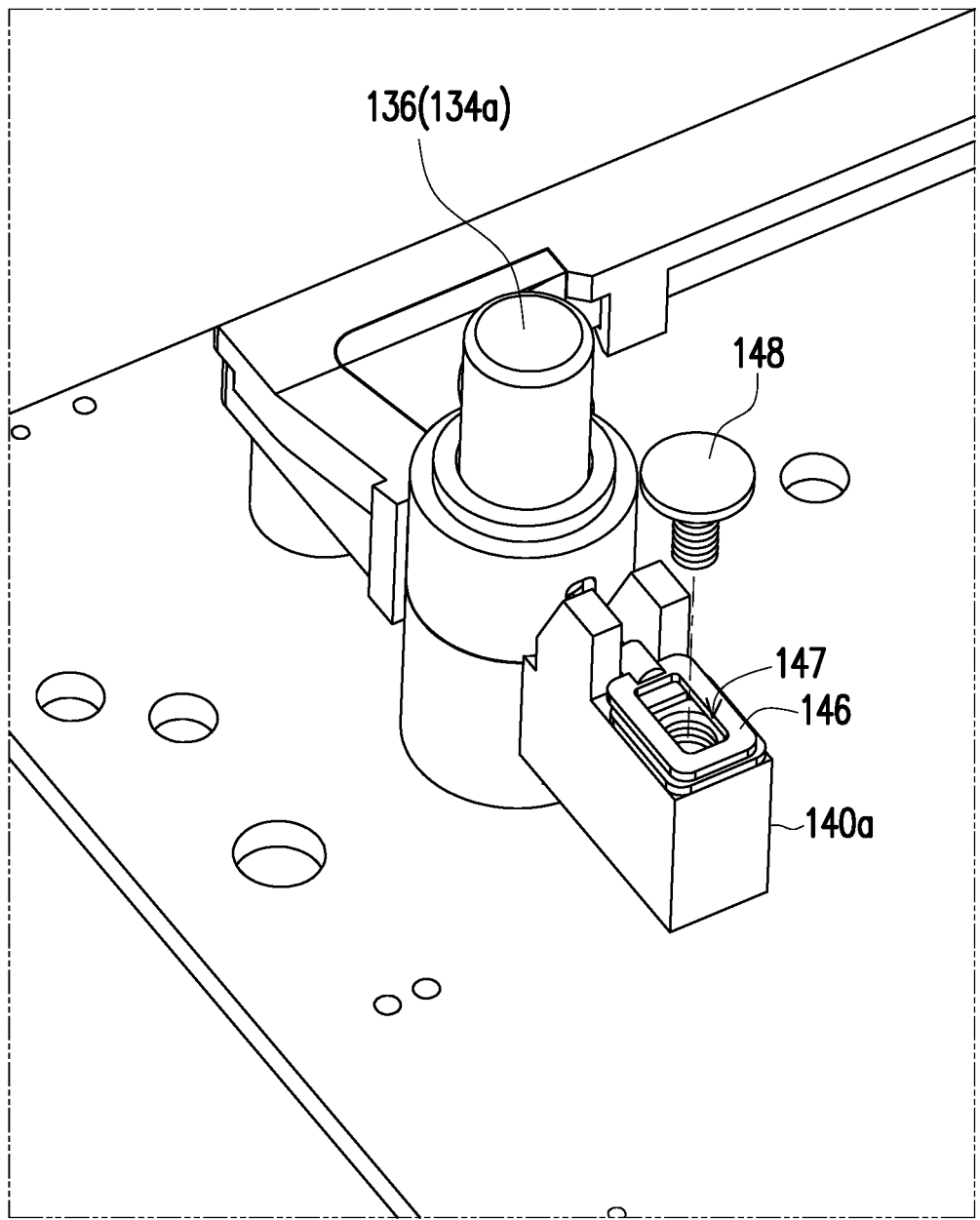
FIG. 10 is a partial schematic diagram of the locking member of FIG. 6 moving upward.

FIG. 10 is a partial schematic diagram of the locking member of FIG. 6 moving upward. Please refer to FIG. 10. In the present embodiment, the transmission mechanism 130a further includes a fixing part 146 disposed at an end of the linkage part 131 away from the release structure 120. The fixing part 146 includes a through hole 147. The transmission mechanism 130a further includes a locking member 148. The locking member 148 passes through the through hole 147, presses against the fixing part 146, and is fixed to the base body 140a.

In an embodiment, the fixing part 146 has a hollow rectangular shape or elliptical shape, so that the manufacturer may finely adjust the position of the fixing part 146 relative to the screw hole of the base body 140a. For example, if the linkage part 131 is too loose, then the linkage part 131 may not be well linked when the button 136 is pressed down. At this point, the manufacturer may slightly move the fixing part 146 in a direction away from the button 136 (for example, the lower right of FIG. 10), and then fix the locking member 148 to the base body 140a, so that the fixing part 146 is pressed by the locking member 148. In this way, the linkage part 131 may be slightly tightened, and may be well linked by the button 136.

Therefore, the fixing part 146 has a hollow rectangular shape or elliptical shape design, so that when the fixing part 146 is slightly moved in a direction away from the button 136 or close to the button 136, the locking member 148 may still pass through the through hole 147 of the fixing part 146, and then be locked to the base body 140a. In other words, the elongated through hole 147 may be used to provide a space for the fixing part 146 to be finely adjusted relative to the base body 140a.

Please return to FIG. 7, in the present embodiment, the base body 140a further includes a bottom wall 142 that is elevated, and the board body 110 includes an electronic element 112. The electronic element 112 is, for example, a component such as a resistor, a capacitor, or a chip, and the electronic element 112 is located under the elevated bottom wall 142. Therefore, since the base body 140a of the transmission mechanism 130 may be elevated, the transmission mechanism 130 may not affect the circuit layout on the board 110 body.

Figure 11:
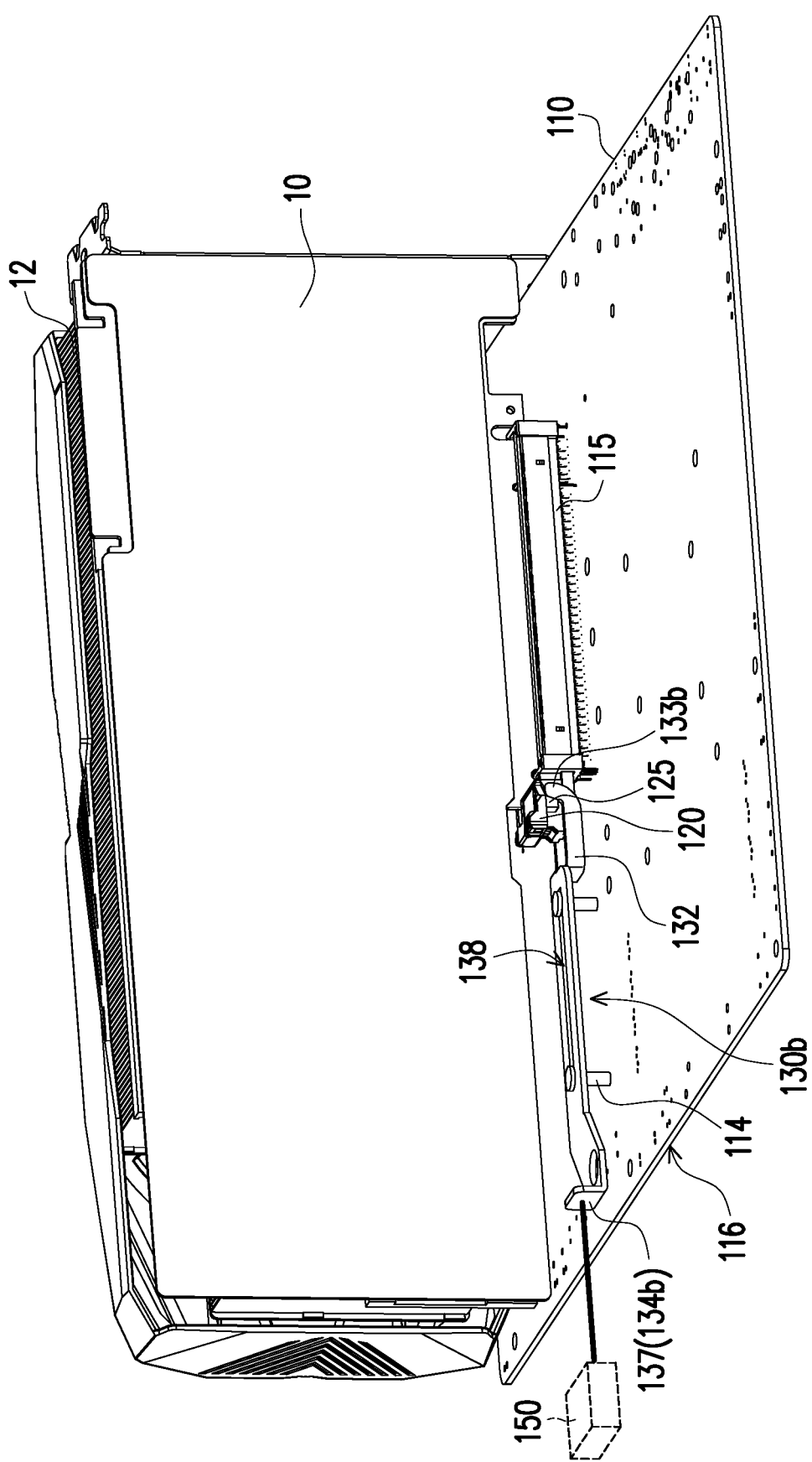
FIG. 11 is a schematic diagram of a circuit board according to another embodiment of the disclosure.
Figure 12:
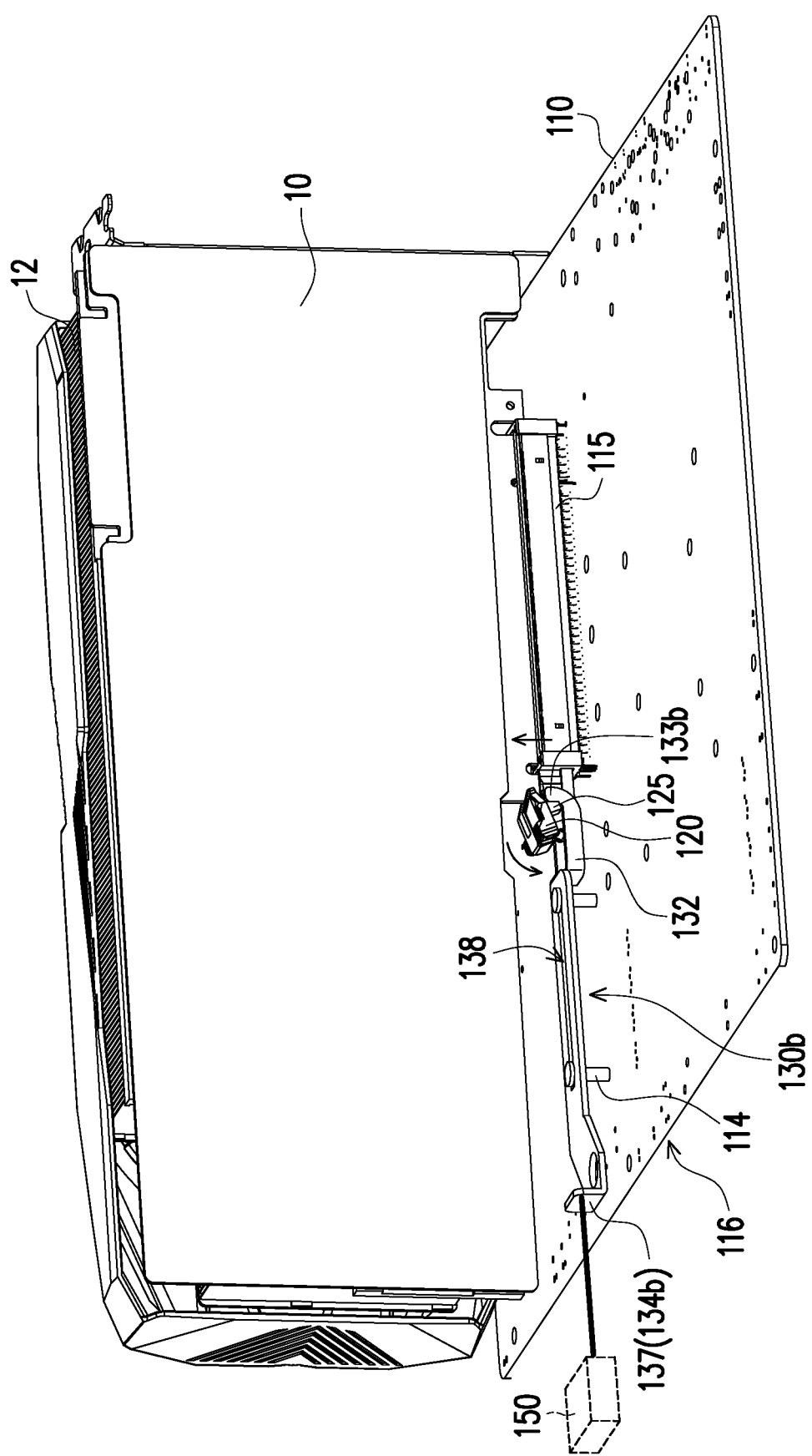
FIG. 12 is a schematic diagram of pulling a handle of the circuit board of FIG. 11.

FIG. 11 is a schematic diagram of a circuit board according to another embodiment of the disclosure. FIG. 12 is a schematic diagram of pulling a handle of the circuit board of FIG. 11. Referring to FIG. 11 and FIG. 12, the main difference between a transmission mechanism 130b of the present embodiment and the transmission mechanism 130 of FIG. 3 is that: in the present embodiment, the transmission mechanism 130b includes a linkage part 132 that may be one or a plurality of rod bodies or objects fixed together, but the form of the linkage part 132 is not limited thereto.

The linkage part 132 is located between a contact part 133b and a stressed part 134b. The contact part 133b is abutted against an abutting part 125 of the release structure 120. The stressed part 134b is, for example, a handle 137. The handle 137 may be close to an edge 116 of the board body 110 to facilitate the operation of the user.

In the present embodiment, the user only needs to pull the handle 137 to drive the linkage part 132. As a result, the contact part 133b pulls the abutting part 125 of the release structure 120, so that the release structure 120 is rotated to release the expansion card 10.

Moreover, in the present embodiment, the linkage part 132 includes a guide groove 138, and the plate body 110 includes a guide column 114 penetrating the guide groove 138. The linkage part 132 may be moved on the plate body 110 in a specific direction via the cooperation of the guide column 114 and the guide groove 138.

Moreover, in the present embodiment, the circuit board 100 further includes a driving module 150. The driving module 150 is connected to the stressed part 134b of the transmission mechanism 130, and is capable of electrically moving the stressed part 134b.

The driving module 150 is, for example, a motor, a hydraulic cylinder, a pneumatic cylinder, an electromagnet, etc., and the type of the driving module 150 is not limited thereto. In addition, the driving module 150 may be disposed outside the board body 110 or on the board body 110, and the position of the driving module 150 may be adjusted according to the space configuration, and is not limited to the figures.

Based on the above, the circuit board of the disclosure uses a transmission mechanism to rotate the release structure relative to the card slot, thereby releasing the expansion card. In this way, even if the release structure is blocked by a structure such as the expansion card and the heat dissipation fins, the user may still readily rotate the release structure.

What is claimed is:

1. A circuit board, comprising:
a board body;
a card slot disposed on the board body and adapted for inserting an expansion card;
a release structure pivotably disposed beside the card slot, the release structure including a pivotal shaft such that the release structure is pivotable about the pivotal shaft; and
a transmission mechanism disposed on the board body, extending along a surface of the board body, and comprising a contact part, a stressed part, and a linkage part that is connected to the contact part and is in contact with the stressed part, wherein the contact part is connected to the release structure, the pivotal shaft being located between the card slot and the contact part,
wherein when the stressed part receives an external force, the contact part is moved via the linkage part correspondingly, so that the release structure is pivoted relative to the card slot about the pivotal shaft, thereby releasing the expansion card.

2. The circuit board of claim 1, wherein the transmission mechanism further comprises a base body, and the linkage part is movably disposed at the base body.

3. The circuit board of claim 2, wherein the linkage part is a wire, an end of the linkage part is connected to the contact part, and the stressed part comprises a pull ring and is disposed at another end of the linkage part.

4. The circuit board of claim 3, wherein the transmission mechanism further comprises a roller rotatably disposed in the base body, and the linkage part is wound around an outer edge of the roller.

5. The circuit board of claim 2, wherein the stressed part comprises a button movably disposed at the base body, and the button is able to be pressed to interact with the linkage part.

6. The circuit board of claim 5, wherein the base body comprises a bottom wall that is elevated, the board body comprises an electronic element, and the electronic element is located under the bottom wall.

7. The circuit board of claim 5, wherein the linkage part is a wire, an end of the linkage part is connected to the contact part, another end of the linkage part is fixed to the base body, and the button is pressed against the linkage part.

8. The circuit board of claim 7, wherein the transmission mechanism further comprises a fixing part and a locking member, the fixing part is disposed at the another end of the linkage part, and the locking member passes through the fixing part and is fixed to the base body.

9. The circuit board of claim 8, wherein the fixing part has a hollow rectangular shape or elliptical shape.

10. The circuit board of claim 1, wherein the linkage part includes at least one rod body.

11. The circuit board of claim 1, further comprising:
a driving module, connected to the stressed part of the transmission mechanism.

* * * * *